United States Patent
Bruel et al.

(10) Patent No.: US 8,184,032 B2
(45) Date of Patent: May 22, 2012

(54) HIGH-SPEED ANALOG-DIGITAL CONVERTER HAVING A SIGNAL FOLDING STRUCTURE IMPROVED BY REDUCING THE NUMBER OF ELEMENTARY CELLS

(75) Inventors: Sandrine Bruel, Grenoble (FR); François Bore, Revel (FR)

(73) Assignee: E2V Semiconductors (FR)

( * ) Notice: Subject to any disclaimer, the term of this patent is extended or adjusted under 35 U.S.C. 154(b) by 52 days.

(21) Appl. No.: 12/936,312

(22) PCT Filed: Mar. 26, 2009

(86) PCT No.: PCT/EP2009/053570
§ 371 (c)(1),
(2), (4) Date: Oct. 25, 2010

(87) PCT Pub. No.: WO2009/121783
PCT Pub. Date: Oct. 8, 2009

(65) Prior Publication Data
US 2011/0032137 A1    Feb. 10, 2011

(30) Foreign Application Priority Data
Apr. 4, 2008   (FR) .................... 08 01872

(51) Int. Cl.
*H03M 1/34* (2006.01)
(52) U.S. Cl. .................. 341/158; 341/155; 341/156
(58) Field of Classification Search .................. 341/155, 341/156, 158, 159
See application file for complete search history.

(56) References Cited

U.S. PATENT DOCUMENTS

| | | | | |
|---|---|---|---|---|
| 4,599,602 A * | 7/1986 | Matzuzawa et al. | ......... | 341/161 |
| 5,307,067 A * | 4/1994 | Kimura et al. | ......... | 341/159 |
| 5,392,045 A * | 2/1995 | Yee | ......... | 341/156 |
| 5,640,163 A * | 6/1997 | Nauta et al. | ......... | 341/155 |
| 6,346,904 B1 * | 2/2002 | Gaillard et al. | ......... | 341/155 |
| 6,674,389 B2 * | 1/2004 | Bult | ......... | 341/159 |
| 7,277,041 B2 * | 10/2007 | Scholtens | ......... | 341/159 |
| 2001/0040522 A1 | 11/2001 | Kobayashi et al. | | |

FOREIGN PATENT DOCUMENTS

FR          2887708 A1    12/2006

OTHER PUBLICATIONS

Hidri O et al: "A 1.8-V 1.6-GSample/s 8-b Self-Calibrating Folding ADC With 7.26 ENOB at Nyquist Frequency" IEEE Journal of Solid-State Circuits, IEEE Service Center, Piscataway, NJ, US, vol. 39, No. 12, Dec. 1, 2001 (Dec. 1, 2004), pp. 2107-2115, XP011122649 ISSN: 0018-9200 p. 2107-p. 2111; figures 2, 6-8.
International Search Report of Application No. PCT/EP2009/053570 mailed May 20, 2009.

* cited by examiner

*Primary Examiner* — Khai M Nguyen
(74) *Attorney, Agent, or Firm* — Lowe Hauptman Ham & Berner, LLP

(57) ABSTRACT

The invention relates to high-resolution analog-digital converters using so-called folding differential amplifier structures composed of differential circuits (crossed differential pairs) and of loads (cascode transistors). The folding structure according to the invention comprises, in the case where it is desired to produce four curves folded at two periods in the useful range of voltages to be converted, four folding blocks (one per curve). The first comprises 7 differential circuits and eight loads, the end loads not being linked to the output of the block. The other blocks comprise 6 differential circuits and eight loads, the last load of each block not being linked to the output of this block. Gains are achieved in terms of bulk, consumption and operating speed, with respect to existing structures.

3 Claims, 5 Drawing Sheets

HIGH-SPEED ANALOG-DIGITAL CONVERTER HAVING A SIGNAL FOLDING STRUCTURE IMPROVED BY REDUCING THE NUMBER OF ELEMENTARY CELLS

RELATED APPLICATIONS

The present application is based on International Application Number PCT/EP2009/053570, filed Mar. 26, 2009 and claims priority from French Application Number 0801872, filed Apr. 4, 2008, the disclosures of which are hereby incorporated by reference herein in their entirety.

The invention relates to high-resolution analog-digital converters using so-called folding differential amplifier structures.

BACKGROUND OF THE INVENTION

The principle of signal folding structures is as follows: the analog input signal to be converted is applied to the input of a group of differential amplifiers receiving regularly distributed reference voltages; these amplifiers provide so-called "folded" signals having an amplitude which varies nearly sinusoidally with the amplitude of the input signal, with a period which is defined by the separation of the reference voltages distributed in a useful range of amplitudes to be converted. The number of reference voltages in a group defines the number of periods of the folded-signal curve in this useful range. The bits of the analog-digital conversion for an input voltage value are defined by whether the signal arising from the folding structure belongs to one of the intervals defined by the zero crossings of the folded-signal curve.

The reference voltages are produced by one or more resistor bridges supplied by a reference current which is constant or is supplied between two reference voltages. The precision structures intended for high-resolution conversion are most often differential and the case of differential structures will be described hereinafter.

FIG. 1 represents the basic setup of a signal folding structure. It comprises two elementary differential circuits each consisting of a double differential pair of transistors which establish currents dependent on the difference between the voltage to be converted and reference voltages, and two load circuits which convert these currents into voltage. A signal folding block comprises several groups of two differential circuits and the associated load circuits. A folding structure can comprise several folding blocks. The number of circuits in a block determines the number of folding periods of the folding curve engendered by this block. The number of blocks determines the number of simultaneously engendered parallel folding curves. The folding curves are spaced regularly apart and their zero crossings are precisely defined with respect to the voltage references provided by the resistor bridges.

The differential circuits each comprise four inputs (two pairs of differential inputs) and two outputs; the outputs of adjacent circuits are linked to one another in a manner that will be detailed further on. Each load circuit may be considered to comprise an input and an output; the input is linked to a differential-circuit output; the output is linked to an output conductor of the folding block.

As will be seen, there are in one and the same folding block load circuits of odd rank whose input is connected to a first output of a differential circuit (and connected at the same time to a second output of an immediately preceding differential circuit in the series) and load circuits of even rank whose input is connected to a second output of the differential circuit (and connected at the same time to a first output of an immediately following differential circuit). All the outputs of load circuits of odd rank are connected to a first output conductor of the folding block, and all the outputs of load circuits of even rank are connected to a second output conductor of the block.

FIG. 1 represents an exemplary setup of a group of two adjacent differential circuits $CR_j$ and $CR_{j+1}$ and of two corresponding load circuits $CH_j$ and $CH_{j+1}$ connected as indicated above and intended to be linked to other differential circuits in one and the same folding block. The index j represents the rank of the consecutive circuits in the series making up a block.

A differential circuit such as CRj comprises two differential pairs of transistors; each pair is supplied by a constant current source $I_0$. The current is the same for the two pairs and for all the differential circuits. The transistors of a pair are linked by their emitters to this current source. Hereinafter it will be considered that the transistors are bipolar transistors, the invention being usable with MOS transistors also.

The circuit CRj possesses four inputs which are the bases of the four transistors making up the two pairs. The first pair receives respectively a signal voltage to be converted Vinp and a reference voltage $Vrefp_j$. The second pair receives respectively a signal voltage to be converted Vinn and a reference voltage $Vrefn_j$. The group of voltages Vinp, Vinn constitutes the differential input voltage to be converted, to be compared with differential reference voltages defined by the voltages $Vrefp_j$, $Vrefn_j$.

The same voltages Vinp and Vinn are applied to the corresponding transistors of all the differential circuits. They can originate from a sample-and-hold unit or from a simple differential amplifier. The reference voltages are different for the various differential circuits: they are voltages $Vrefp_{j+1}$ and $Vrefn_{j+1}$ for the circuit $CR_{j+1}$ of rank j+1. The reference voltages for the various differential circuits are regularly distributed between a low value and a high value and they originate from the intermediate taps of a resistor bridge (not represented).

The collector of the transistor which receives the input voltage in a differential pair is linked to the collector of the transistor which receives a reference voltage on the other pair. The collectors thus coupled in twos constitute two outputs $S1_j$ and $S2_j$ of the differential circuit $CR_j$.

These outputs $S1_j$ and $S2_j$ serve on the one hand for the connection between the consecutive differential circuits and on the other hand for the connection to the load circuits.

The first output $S1_j$ of the differential circuit of rank j is connected to the second output (not represented) of the immediately preceding differential circuit, of rank j−1 (if it exists). Reciprocally, the second output $S2j$ of the differential circuit of rank j is linked to the first output of the differential circuit of immediately following rank j+1 (if it exists).

The load circuit of rank j ($CH_j$) has its input $Ec_j$ linked to the first output $S1_j$ of the differential circuit $CR_j$ of like rank.

It follows from this that each load circuit is shared between two adjacent differential circuits since a load circuit is connected at one and the same time to the first output of the circuit of rank j and to the second output of the circuit of rank j−1.

The output $Sc_j$ of the load circuit of rank j is linked to an output conductor Ap, but the output of the load circuit of immediately following rank is linked to another output conductor An. These two conductors are common to the whole of the folding block and constitute the two outputs (providing a folded signal) of the block. The outputs of the load circuits of the succession are alternately connected to the conductor An and to the conductor Ap. For example, all the load circuits of odd rank have their output linked to the conductor Ap and all the load circuits of even rank have their output linked to the conductor An.

The load circuits are moreover all identical; the load circuit of rank j is, in this example, made up of two transistors which are respectively a cascode transistor and a follower transistor; the cascode transistor has its emitter linked to the input $Ec_j$, its base linked to a fixed bias potential common to the whole of the folding block, and its collector linked by a resistor (identical for all the circuits) supplied by a supply voltage; the follower transistor has its base linked to the collector of the cascode transistor, its emitter linked to a constant current source of value and its collector linked to a supply voltage. The output $Sc_j$ of the load circuit is taken on the emitter of the follower transistor. The cascode transistor serves to prevent the voltage on the outputs of the differential circuit varying overly as a function of the input signal level Vinp, Vinn.

FIG. 2 represents the general organization of a folding structure with several blocks each comprising several differential circuits and the associated loads. The example is given for a structure which engenders four folding curves (and which comprises for this purpose four blocks represented one below the other), each folding curve comprising two complete periods in a useful range of analog voltages to be converted.

To engender four different curves, the blocks receive different voltages originating either from a respective resistor bridge for each block or from a common bridge for all the blocks, the successive taps along the bridge serving successively for the various blocks. The resistor bridge or bridges are not represented so as not to overburden the diagram.

Each block comprises a pair of outputs: Ap, An for the first block, Bp, Bn for the second block, and Cp, Cn, Dp, Dn for the last two.

These outputs provide folded signals visible in FIG. 3: output signal folded as a function of the input voltage. Each block provides a respective folded curve A, B, C, D. Curve A is a representation of the voltage obtained between the output conductors Ap and An of the first block. Curves B, C, D represent the output voltages of the other blocks. The folding blocks are usable in an input range between a low voltage Vb and a high voltage Vh. In this range the folded curves of sinusoidal shape are truly regular and their intersections are spaced regularly apart. Outside of this range, the curves are deformed by edge effects related to the fact that the loads of the differential circuits of the ends of the block are not shared between two differential circuits.

The number of differential circuits required in each block to engender two folding periods in the useful range Vb, Vh is four. This is because to each differential circuit there corresponds one zero crossing of the folding curve and four zero crossings are necessary to complete the two periods. However, the first folding block comprises five differential circuits and not four since the folding curve A comprises in total five zero crossings if the zero crossing at Vb and the zero crossing at Vh are included; these zero-crossings for Vb and Vh are required in order to define the limit values Vb, Vh of the useful range.

Consequently, returning to the diagram of FIG. 2, it is possible to consider that the circuits required for the formulation of the four folding curves A, B, C, D each with two complete periods are:

the differential circuits CR1 to CR5 and the corresponding load circuits CH1 to CH6 for the first block
differential circuits CR2 to CR5 and corresponding load circuits CH2 to CH6 for each of the other blocks.

To best ensure the regularity of the curves in the vicinity of the limits of the useful range with a view to an analog processing downstream, at least one additional differential circuit on each side and an associated load circuit is furthermore provided. For the first block (curve A), these additional circuits are the differential circuits $CR_0$ and $CR_6$ and the associated load circuits $CH_0$ and $CH_7$. For the other blocks, the additional circuits are the circuits $CR_1$ and $CR_6$ and the associated load circuits $CH_1$ and $CH_7$. Finally, to ensure global symmetry of the whole structure (and notably symmetry and homogeneity of the loads), matters are contrived so that there is the same number of differential circuits and of loads in all the blocks, thereby involving other additional circuits $CR_0$ and $CH_0$ for the three blocks providing the curves B, C, D. This enables all the curves A, B, C, D to have exactly the same amplitude and regularly spaced zero crossings.

Consequently, in the structure of FIG. 2, the differential circuits and load circuits defining the folding curves of the useful range are the circuits represented with bolder lines in the figure, and the additional circuits, which serve only to better adjust these curves, are represented by slender lines.

It is understood that the number of additional circuits is significant, and engenders high consumption of current and high bulk on the integrated circuit. Indeed, in the given example, there are 17 differential circuits and 21 load circuits establishing the desired folding functions and 11 differential circuits and 11 additional load circuits to improve these curves.

SUMMARY OF THE INVENTION

The invention is aimed at reducing the number of these additional circuits in analog-digital converters with folding structures.

For this purpose, the invention proposes an analog-digital converter with signal folding circuits, comprising at least two folding blocks, each block comprising a series of N+1 differential circuits of rank 1 to N+1, with N integer, and a series of N+2 load circuits of rank 1 to N+2 associated with the differential circuits of each series, the differential circuits of each block being juxtaposed and linked to one another by their outputs, each differential circuit having four inputs and two outputs, the first output of a differential circuit of rank j being linked to the second output of a preceding differential circuit of rank j−1 of the series and the second output of the differential circuit considered being linked to the first output of the following differential circuit of rank j+1, a first load circuit of rank j being linked to the first output of the differential circuit considered of rank j, this load circuit being shared with the preceding differential circuit of rank j−1 of the series, and a second load circuit of rank j+1 being linked to the second output of the differential circuit concerned of rank j, this load circuit being shared with the following differential circuit of rank j+1 of the series, the load circuits of even rank having an output connected to a first common output of the series and the load circuits of odd rank having an output connected to a second common output of the series, characterized in that there are provided for all the blocks an additional differential circuit of rank N+2 and an additional load circuit of rank N+3 connected to the second output of the additional differential circuit, the output of the latter load circuit not being linked to a common output of the series, and in that there is furthermore provided, in the first folding block, a differential circuit of rank 0 and a load circuit of rank 0 connected to the first output of the differential circuit of rank 0, the output of the load circuit of rank 0 not being linked to a common output of the first block.

Although the integral non-linearity error engendered by this structure is slightly impaired, the number of elementary differential circuits and the number of associated load circuits is significantly reduced, so that considerable gains are achieved in terms of consumption and bulk, as well as in operating speed of the converter.

The number of periods of the folded curves in the useful range of voltages to be converted is N/2.

The load circuits consist preferably of a cascode transistor and a follower transistor. The load circuits not having any output linked to an output of the block do not, however, need to have a follower transistor.

The differential circuits consist preferably of a double differential pair of transistors, a transistor of one pair having its collector linked to the collector of a transistor of the other pair and vice versa. In practice, the collector of a transistor of one pair which receives on its base a voltage to be converted is linked to the collector of a transistor of the other pair which receives on its base a reference voltage, and likewise for the other two transistors.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 3:
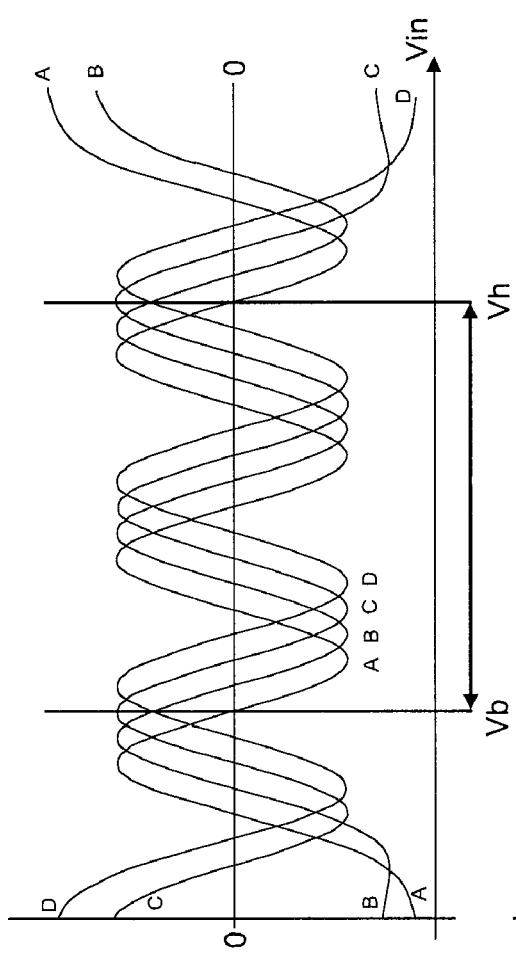
FIG. 3 represents the folding curves of the structure of FIG. 2.
Figure 4:
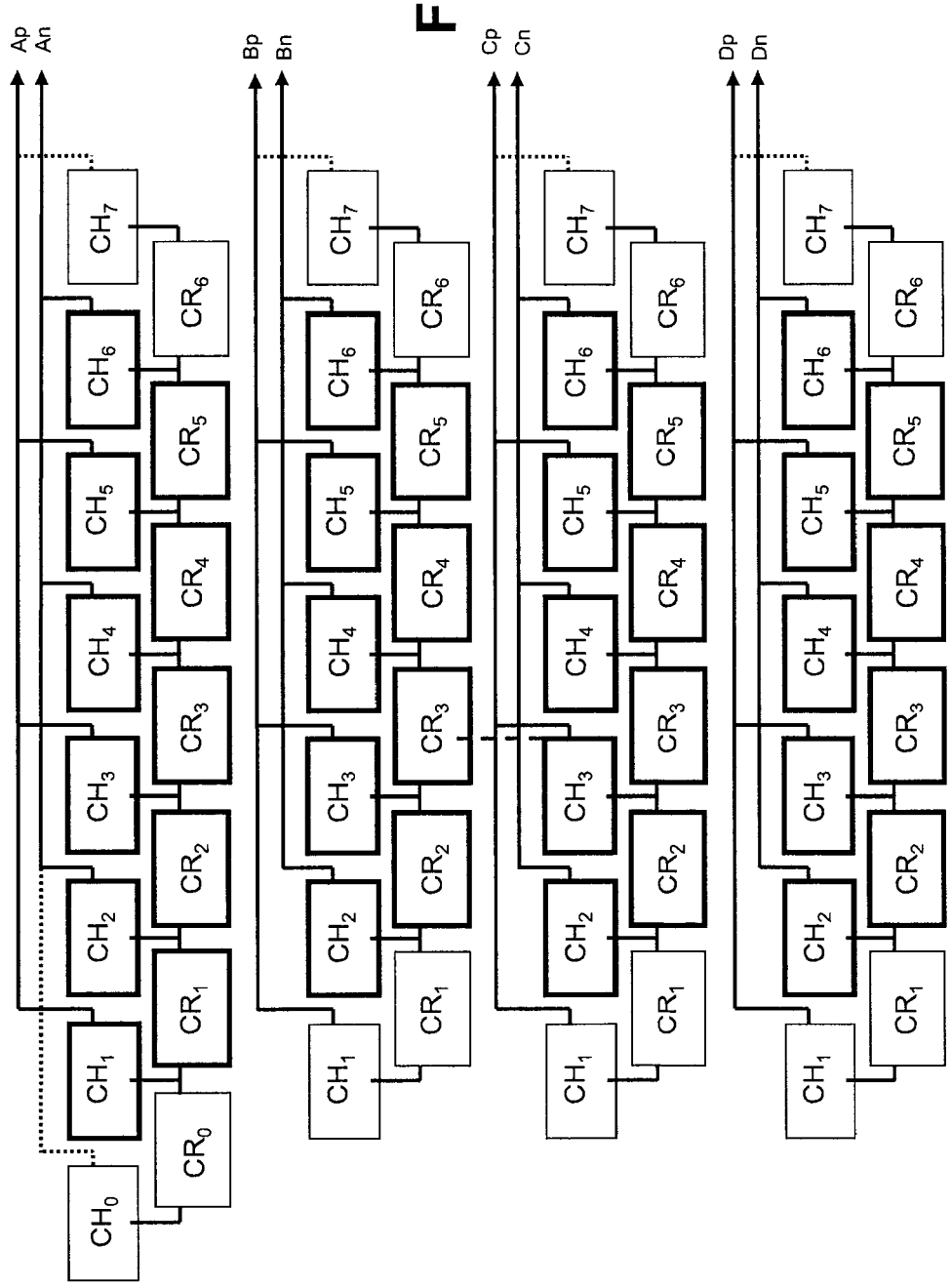
FIG. 4 represents the general setup of a folding structure according to the invention.
Figure 6:
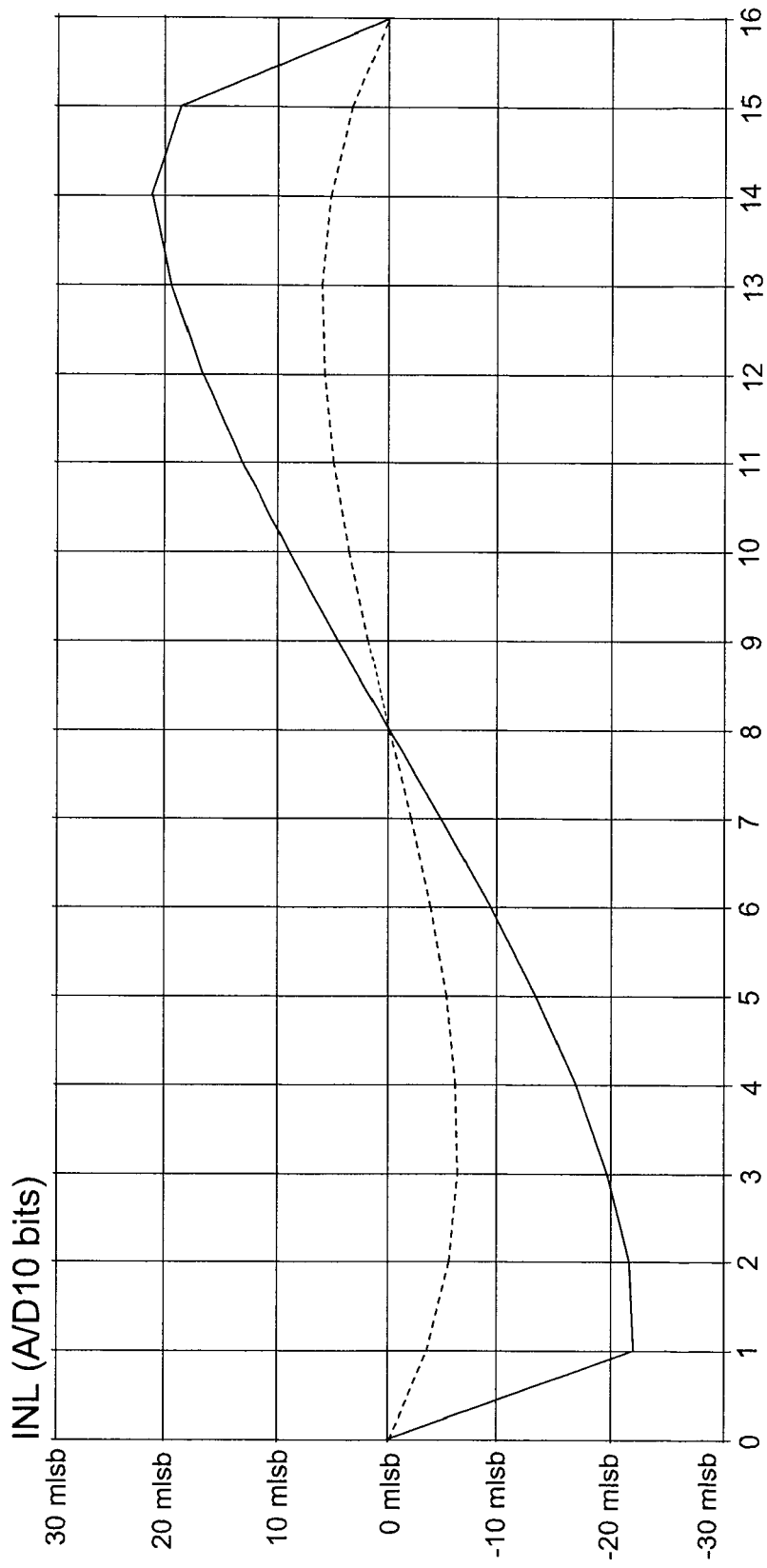
FIG. 6 represents an integral non-linearity curve for the structure according to the invention in the case of an analog-digital converter using the structure of FIG. 4.

FIG. 4 will be compared with FIG. 3. It corresponds like FIG. 3 to a folding structure with four folding blocks placed one above another in the figure. Each block possesses two outputs (for a differential structure) which are An and Ap for the first block, Bn and Bp for the second, Cn and Cp for the third, and Dn and Dp for the fourth.

The folding blocks each comprise a series of differential circuits and a series of load circuits. The differential circuits are designated by the references $CR_j$, the index j corresponding to the rank of the differential circuit in the series. The load circuits are designated by the references $CH_j$, the index j corresponding also to the rank of the load circuit in the series.

Figure 1:
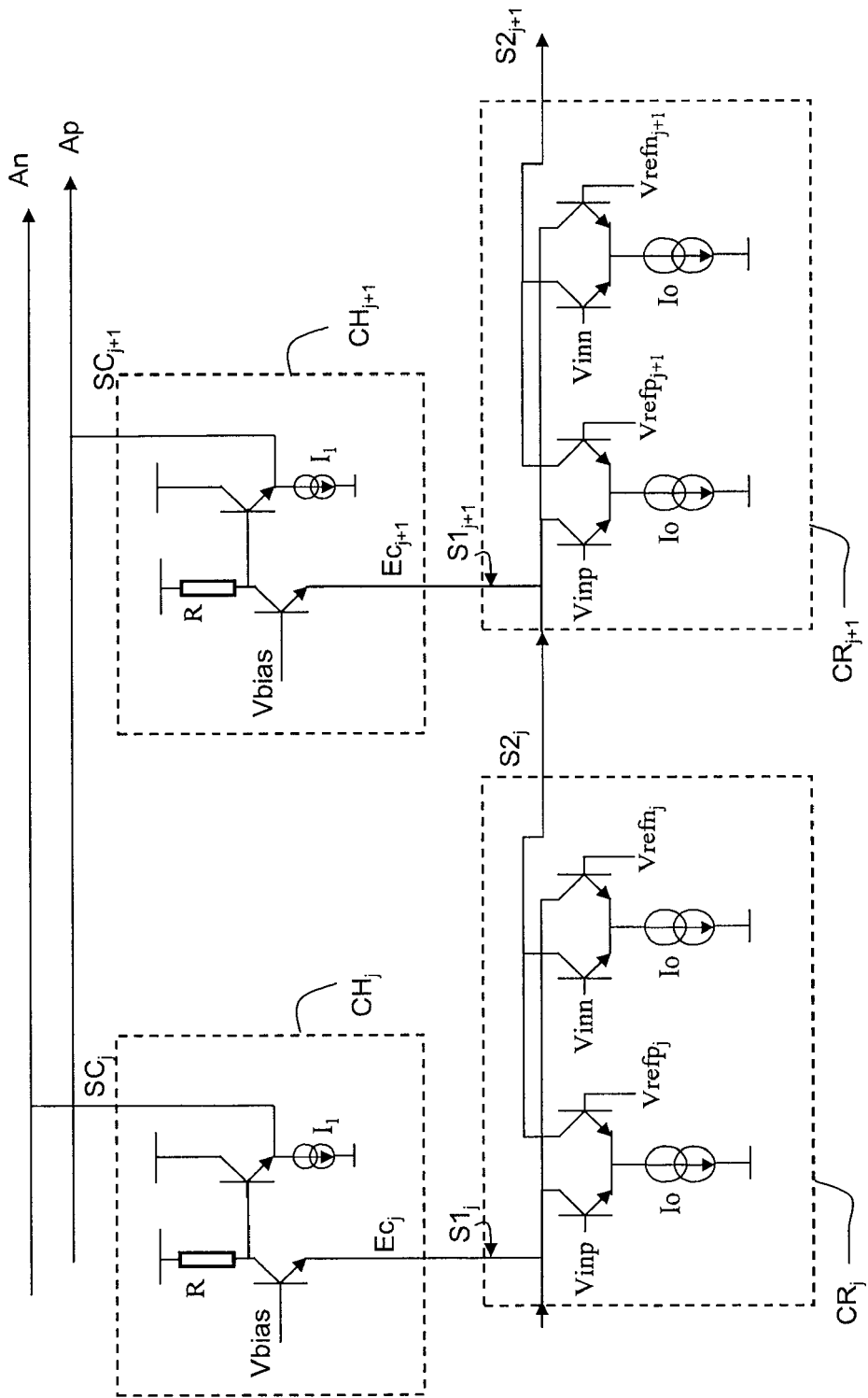
FIG. 1 represents an exemplary signal folding structure.

The differential circuits and the load circuits may be in accordance with those of FIG. 1 and they will not be described again: a differential circuit comprises in summary a double differential pair of transistors, four inputs and two outputs. The first output of a differential circuit $CR_j$ of rank j is linked to an input of a load circuit $CH_j$ of rank j and to the second output of the differential circuit $CR_{j-1}$ of rank j−1. The second output of a differential circuit $CR_j$ is linked to an input of a load circuit $CH_{j+1}$ of a differential circuit of rank j+1 and to an input of a load circuit of rank j+1. The outputs of all the load circuits of odd rank are linked to a first output of the folding block (for example the output Ap for the first block) and the outputs of all the load circuits of even rank are linked to a second output (for example the output An for the first block) of the folding block. The load circuits may be cascode stages having an input for current on a transistor emitter (with fixed base bias) and an output for voltage on the emitter of another transistor which is a follower transistor.

There are in each folding block at least N differential circuits serving to produce the necessary foldings so that the folding curve passes through zero N times in a useful range of input voltages Vin to be converted. N is an integer, even in the general case where the number of periods of the sinusoidal folded curve is an integer. It is recalled that in a differential structure, the voltage Vin possesses two values which are a positive value Vinp and a negative value Vinn, but to simplify the explanations a single value Vin representing the difference Vinp−Vinn will be considered. In the analog-digital conversion, it is sought to define a digital value of Vin by comparing this value with reference values $Vref_j$ which are themselves differential and which are therefore differences $Vrefp_j - Vrefn_j$.

In the example of FIG. 4, it is sought to produce 2 complete periods of folding curve in the useful range Vb, Vh, and therefore at least N=4 differential circuits are required for each of the blocks. However it is desired that one of the curves should cross through zero both for the value Vb and for the value Vh, thereby requiring in fact N+1 differential circuits for the first curve.

These differential circuits strictly necessary for producing the N zero crossings are represented in bold in FIG. 4. These are the circuits $CR_1$ to $CR_5$ (rank 1 to N+1) for the first block, and the circuits $CR_2$ to $CR_5$ (ranks 1 to N) for the other three blocks.

But for symmetry reasons, N+1 zero crossings are also envisaged for these other three blocks. There is therefore an additional differential circuit $CR_1$ of rank 1 for each of the other three blocks.

The loads associated with the N+1 differential circuits thus described in each block are designated by the same rank, but for N+1 differential circuits there are N+2 load circuits since a load is connected to each of the two outputs of a differential circuit. The loads associated with the strictly necessary differential circuits are in bold in FIG. 4. These are the loads $CH_1$ to $CH_6$ for the first block, and the loads $CH_2$ to $CH_6$ for each of the other three. The loads associated with the additional differential circuits previously mentioned are loads $CH_1$ represented by slender lines.

According to the invention, in addition to the differential circuits and the associated loads which have just been specified, there are envisaged additional differential circuits connected differently from the others:

all the blocks possess an additional differential circuit of rank N+2 and an additional load circuit connected to the second output of the additional differential circuit, but this additional load circuit of rank N+3 has no output linked to an output conductor of the block; in the figure, these are the circuit $CR_6$ and the load $CH_7$;

the first folding block possesses a differential circuit $CR_0$ of rank 0 and a load circuit of rank 0 which is connected to the first output of the differential circuit of rank 0, but this load circuit has no output linked to an output conductor of the block.

The additional load circuits of rank 0 and of rank N+3 therefore consume current arising from the outputs of the differential circuits of rank 0 and of rank N+2, but they do not contribute directly to the output signal present on the output conductors of the block.

For this reason, the additional load circuits of rank 0 and N+3 are not necessarily identical to the load circuits of rank 1 to N+2. For example, in the case of FIG. 1 where the load circuit comprises a cascode transistor and a follower transistor linked to the output conductor, the follower transistor in the load circuits of rank 0 and N+3 can be purely and simply omitted. The additional differential circuits of rank 0 and N+2 are all identical to the differential circuits of rank 1 to N+1.

Figure 5:
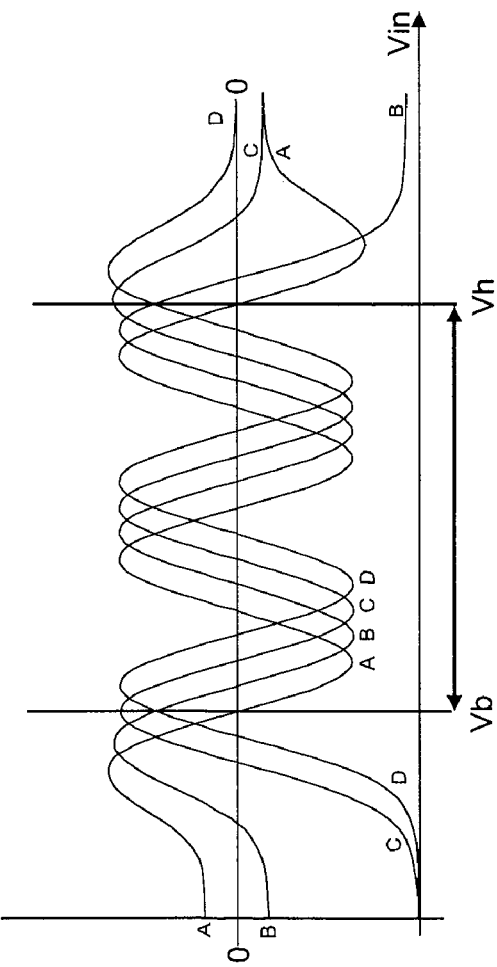
FIG. 5 represents the associated folding curves.

FIG. 5 represents the folding curves which result from the structure of FIG. 4. It is seen that these curves are not entirely identical to the curves of FIG. 3. It may even be said that they produce zero crossings that are less regularly distributed than those of FIG. 3. But the additional non-linearity error engendered by this arrangement is very small relative to the other errors that may be encountered in an analog-digital converter, and in particular the errors due to technological inaccuracies, for example in the resistance values of the resistor bridges which define the zero crossings of the folding curves, or in the offset voltage values of the differential pairs.

Figure 2:
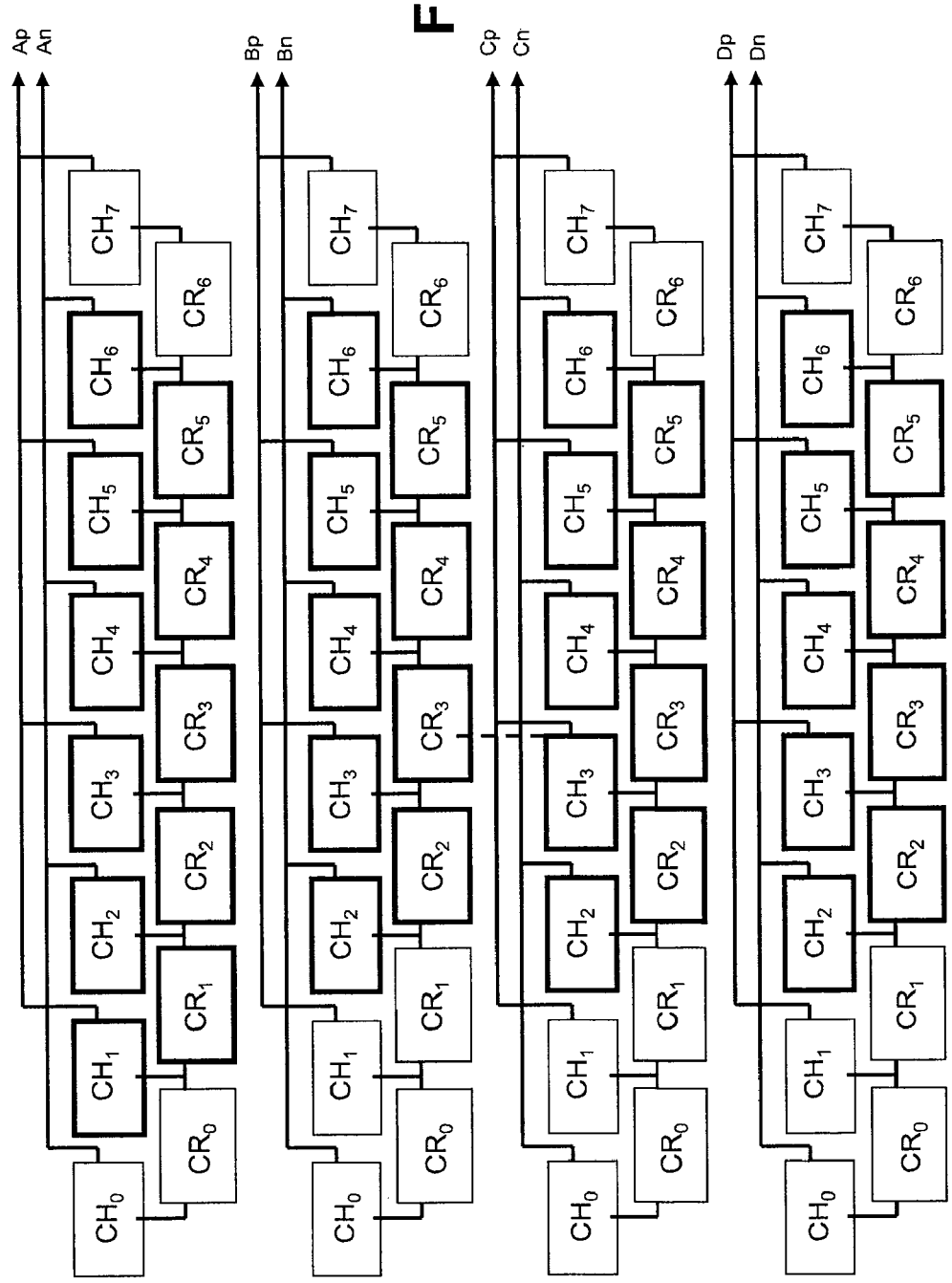
FIG. 2 represents the general setup of a structure of the prior art in the case where four folded curves at two folding periods in the useful range of input voltages are desired.

Typically, the following simulations have been done in a concrete example of a 10-bit resolution converter: the errors of technological variations engender an inaccuracy of the order of 1.2 LSB (LSB=least significant bit) peak to peak; the integral non-linearity error (INL) due intrinsically to the structure of FIG. 2 does not exceed 0.025 LSB peak to peak; the integral non-linearity error related to the structure of FIG. 4 under the same conditions (notably of values of currents consumed by the inputs of the differential amplifiers and of value of current in the resistor bridge) has turned out to be greater than that of FIG. 2 but has not exceeded 0.050 LSB, this being completely negligible compared with the errors due to the technological inaccuracy.

FIG. 5 represents the integral non-linearity curve measured for FIG. 2 (dashed line) and for FIG. 4 (solid line). Along the abscissa are the 16 points of zero crossing of the four folding curves in the useful range between Vb and Vh. Along the ordinate, graduated in thousandths of LSB normalized for a resolution of 10 bits, is the systematic error engendered by the structure chosen to do the folding.

But despite this increase in the integral non-linearity error, the structure of FIG. 4 is much more advantageous than that of FIG. 2, in terms of numbers of differential circuits and of associated load circuits. Gains are achieved in terms of bulk, current consumption and speed.

The structure of FIG. 2 uses, for four folding curves with two folding periods each in the useful range, 28 differential circuits and 32 associated load circuits. The structure of FIG. 4 uses 25 differential circuits and 29 associated load circuits. Out of these 29 load circuits, only 25 consume current on the output conductors of the folding blocks. A gain of about 10% is achieved with regard to bulk and dissipation, and 25% with regard to the load of the outputs of the folding blocks.

For a structure with 8 folding blocks and two sinusoid periods per curve, we would go from 56 differential circuits and 64 load circuits to 49 differential circuits and 57 load circuits.

The gain is lower but nevertheless significant for a structure providing folding curves with four sinusoid periods in the useful range.

The differential structure according to the invention can serve most particularly as the input stage of an analog-digital converter, this stage receiving directly the voltage to be converted Vinn, Vinp of a differential sample-and-hold unit. This converter input stage may be followed by an interpolation structure producing, on the basis of the outputs of the first stage, folded curves intermediate between the curves obtained in the first stage. Another folding stage may be envisaged downstream of this interpolation structure.

The invention is particularly beneficial in respect of converters of medium resolution (between 6 and 12 bits).

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An analog-digital converter with signal folding circuits, comprising at least two folding blocks, each block comprising a series of N+1 differential circuits of rank 1 to N+1, with N integer, and a series of N+2 load circuits of rank 1 to N+2 associated with the differential circuits of each series, the differential circuits of each block being juxtaposed and linked to one another by their outputs, each differential circuit having four inputs and two outputs, the first output of a differential circuit of rank j being linked to the second output of a preceding differential circuit of rank j−1 of the series and the second output of the differential circuit considered being linked to the first output of the following differential circuit of rank j+1, a first load circuit of rank j being linked to the first output of the differential circuit considered of rank j, this load circuit being shared with the preceding differential circuit of rank j−1 of the series, and a second load circuit of rank j+1 being linked to the second output of the differential circuit concerned of rank j, this load circuit being shared with the following differential circuit of rank j+1 of the series, the load circuits of even rank having an output connected to a first common output of the series and the load circuits of odd rank having an output connected to a second common output of the series, wherein there are provided for all the blocks an additional differential circuit of rank N+2 and an additional load circuit of rank N+3 connected to the second output of the additional differential circuit, the output of the latter load circuit not being linked to a common output of the series, and in that there is furthermore provided, in the first folding block, a differential circuit of rank 0 and a load circuit of rank 0 connected to the first output of the differential circuit of rank 0, the output of the load circuit of rank 0 not being linked to a common output of the first block.

2. The converter as claimed in claim 1, wherein the differential circuits each comprises a double differential pair of transistors, a transistor of one pair having its collector linked to the collector of a transistor of the other pair and vice versa.

3. The converter as claimed in claim 1, wherein the load circuits comprise a cascode transistor and a follower transistor, with the exception of the load circuits of rank N+3 and of rank 0 which comprise only a cascode transistor but no follower transistor.

* * * * *